United States Patent [19]

Koshikawa

[11] Patent Number: 5,463,581
[45] Date of Patent: Oct. 31, 1995

[54] MEMORY IN WHICH IMPROVEMENT IS MADE AS REGARDS A PRECHARGE OPERATION OF DATA READOUT ROUTES

[75] Inventor: Yasuji Koshikawa, Tokyo, Japan

[73] Assignee: NEC Corporation, Tokyo, Japan

[21] Appl. No.: 295,076

[22] Filed: Aug. 26, 1994

[30] Foreign Application Priority Data

Aug. 29, 1993 [JP] Japan .................................. 5-211320

[51] Int. Cl.⁶ ........................................................ G11C 7/00
[52] U.S. Cl. .................... 365/189.01; 365/191; 365/233; 365/203
[58] Field of Search .................................. 365/203, 233, 365/189.01, 190, 191

[56] References Cited

U.S. PATENT DOCUMENTS

| | | | |
|---|---|---|---|
| 5,268,865 | 12/1993 | Takasugi | 365/233 X |
| 5,291,447 | 3/1994 | Kodama | 365/190 |
| 5,371,715 | 12/1994 | Kim | 365/233 |

FOREIGN PATENT DOCUMENTS 2-294991  12/1990  Japan .

*Primary Examiner*—David C. Nelms
*Assistant Examiner*—Son Mai
*Attorney, Agent, or Firm*—Sughrue, Mion, Zinn, Macpeak & Seas

[57] ABSTRACT

In a semiconductor memory device having first and second main data amplifiers (27, 28) for electrically charging a plurality of read bus pairs (23, 24), a precharge control circuit (26) controls operation of first and second main data amplifiers so that selected ones of the read bus pairs are electrically charged during a predetermined burst period except when each of the first and the second main data amplifiers produces a difference signal. When each of the read bus pairs has a read bus potential difference, each of the first and the second main data amplifiers produces the difference signal and electrically charges each of the read bus pairs in accordance with the difference signal. The read bus potential difference is produced dependent on a bit line potential difference which is produced in each of bit line pairs.

6 Claims, 8 Drawing Sheets

MEMORY IN WHICH IMPROVEMENT IS MADE AS REGARDS A PRECHARGE OPERATION OF DATA READOUT ROUTES

BACKGROUND OF THE INVENTION

This invention relates to a semiconductor memory device such as a synchronous dynamic random access memory (DRAM) and, in particular, to control a state of data readout routes through which data are read out from memory cells.

With a recent development of a micro processing unit (MPU), there arises a strong demand for a semiconductor memory device of a high speed. As one approach therefor, proposal has been made of a synchronous DRAM which is operable in synchronism with an external clock supplied from an external source.

In the manner which will later be discussed in detail with reference to a drawing, a conventional synchronous DRAM comprises a period determining arrangement, a plurality of memory cells, a plurality of word lines, a plurality of bit line pairs, a first processing arrangement, a plurality of read bus pairs, and a second processing arrangement. The period determining arrangement is for determining a burst period. The word lines are connected to the memory cells. The bit line pairs are connected to the memory cells. Each of the bit line pairs comprises two bit lines having a bit line potential difference therebetween. The first processing arrangement is connected to the bit line pairs and is for processing the bit line potential difference into a first difference signal. The read bus pairs are connected to the first processing arrangement and supplied with the first difference signal. Each of the read bus pairs comprises two read buses having a read bus potential difference therebetween. The second processing arrangement is connected to the read bus pairs and is for processing the read bus potential difference into a second difference signal.

The conventional synchronous DRAM further comprises a precharge circuit for carrying out a precharge operation to precharge each of the read bus pairs in response to necessity in the manner known in the art. In the precharge operation, each of the read bus pairs is electrically charged, amplified, and discharged in every one cycle having a cycle time. This results in a large consumption of charging/discharging current of each of the read bus pairs. Particularly when the cycle time is shortened, the charging/discharging current generates a noise on a power supply line and on a ground line in the manner known in the art.

Another prior art example is disclosed in Japanese Patent Prepublication (Kokai or Publication of Unexamined Patent Application) No. 294991/1990. In the prior art example, selected ones of data readout routes are continuously and electrically charged for a predetermined time period. However, it is impossible to apply the prior art example to a case where the data readout routes are connected to a ground line or an earth line through a direct current path in the manner known in the art.

SUMMARY OF THE INVENTION

It is an object of this invention to provide a semiconductor memory device in which charging/discharging current is reduced on carrying out a precharge operation of read bus pairs.

It is another object of this invention to provide a semiconductor memory device of the type described, in which a noise is suppressed on a power supply line and on a ground line.

Other objects of this invention will become clear as the description proceeds.

According to an aspect of this invention, there is provided a semiconductor memory device comprising period determining means for determining a burst period, a plurality of memory cells, a plurality of word lines connected to the memory cells, and a plurality of bit line pairs connected to the memory cells. Each of the bit line pairs comprises two bit lines having bit line potential difference therebetween. The semiconductor memory device further comprises first processing means connected to the bit line pairs for processing the bit line potential difference into a first difference signal and a plurality of read bus pairs connected to the first processing means and supplied with the first difference signal. Each of the read bus pairs comprises two read buses having a read bus potential difference therebetween in dependence on the first difference signal. The semiconductor memory device further comprises second processing means connected to the read bus pairs for processing the read bus potential difference into a second difference signal to electrically charge the read bus pairs in accordance with the second difference signal and control means connected to the period determining means and the second processing means for controlling operation of the second processing means so that selected ones of the read bus pairs are electrically charged during the burst period except when the second processing means produces the second difference signal.

According to another aspect of this invention, there is provided a method of controlling operation of a semiconductor memory device comprising period determining means for determining a burst period, a plurality of memory cells, a plurality of word lines connected to the memory cells, and a plurality of bit line pairs connected to the memory cells. Each of the bit line pairs comprises two bit lines having bit line potential difference therebetween. The semiconductor memory device further comprises first processing means connected to the bit line pairs for processing the bit line potential difference into a first difference signal and a plurality of read bus pairs connected to the first processing means and supplied with the first difference signal. Each of the read bus pairs comprises two read buses having a read bus potential difference therebetween in dependence on the first difference signal. The method comprises steps of processing the read bus potential difference into a second difference signal to electrically charge the read bus pairs in accordance with the second difference signal, and controlling operation of a second processing means so that selected ones of the read bus pairs are electrically charged during the burst period except when the second processing means produces the second difference signal.

DESCRIPTION OF THE PREFERRED EMBODIMENTS

Figure 1:
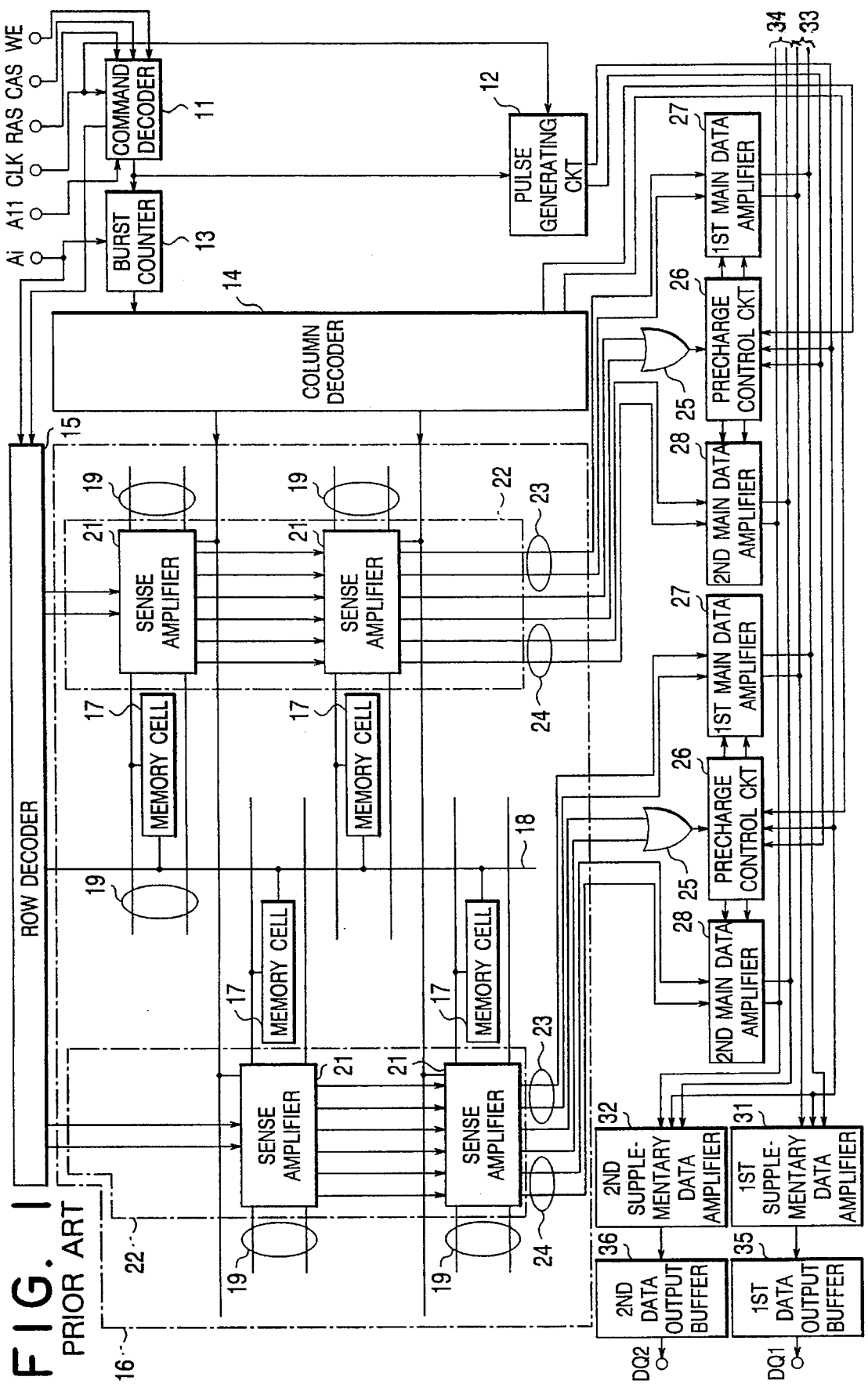
FIG. 1 is a block diagram of a conventional semiconductor memory device.

Referring to FIG. 1, a conventional semiconductor memory device will be described at first for a better understanding of the present invention. The conventional semiconductor memory device is a synchronous DRAM. In the manner which will be described in the following, the conventional semiconductor memory device comprises a command decoder 11, a pulse generating circuit 12, a burst counter 13, a column decoder 14, and a row decoder 15. The command decoder 11 is supplied with an external clock through a clock input terminal CLK, with a row address strobe signal through a row address input terminal RAS, with a column address strobe signal through a column address input terminal CAS, with a write signal through a write input terminal WE, and with an external address signal through an external signal input terminal A11. Responsive to those signals, the command decoder 11 produces an enabling signal and an activation signal. The pulse generating circuit 12 is connected to the clock input terminal CLK and the command decoder 11. Supplied with the external clock and the enabling signal, the pulse generating circuit 12 generates a first and a second pulse signal which will later become clear. The burst counter 13 is connected to an additional signal input terminal A1 and the command decoder 11. Supplied with the enabling signal and with a plurality of additional external address signals through the additional signal input terminal A1, the burst counter 13 produces an internal address signal. The column decoder 14 is connected to the burst counter 13. In accordance with the internal address signal, the column decoder 14 produces a plurality of column selection signals and a first and a second column address signal. The column selection signals will later be presented by symbols YAW1, YAW2, ... The row decoder 15 is connected to the command decoder 11 and the additional signal input terminal A1. In accordance with the activation signal and the additional external address signals, the row decoder 15 produces a plurality of plate selection signals and a plurality of word signals. Each of the plate selection signals has a first plate selection signal and a second plate selection signal modified from the first plate selection signal.

The conventional semiconductor memory device further comprises a semiconductor array 16 connected to the column and the row decoders 14 and 15. The semiconductor array 16 comprises a large number of memory cells (only a few ones of which are depicted) 17, a plurality of word lines (only one of which is depicted) 18, and a plurality of bit line pairs (only a few ones of which are depicted) 19. The word lines 18 are connected to the row decoder 15 and supplied with the word signals. The bit line pairs 19 comprises two bit lines and are supplied with bit signals in the manner known in the art. It is assumed that the bit lines produce a potential difference therebetween which will later become clear. The potential difference will be referred to as a bit line potential difference. Each of the memory cells 17 is connected to each of the word lines 18 and to each of the bit line pairs 19 and is for memorizing a datum in accordance with one of the bit signals and with one of the word signals in the manner known in the art.

The semiconductor array 16 further comprises a large number of sense amplifiers (only a few ones of which are depicted) 21 each of which is of a shared type known in the art. The sense amplifiers 21 are separated into a plurality of sense amplifier groups 22 each of which are directly connected to the row decoder 15. In each of the sense amplifier groups 22, the sense amplifiers 21 are serially connected to one another. In accordance with the bit line potential difference, each of the sense amplifier groups 22 produces, as a first difference signal, a first and a second read bus signal known in the art. The first and the second read bus signals are supplied to first and second read bus pairs 23 and 24, respectively, which are selected as selected ones from a large number of read bus pairs by the row decoder 15. In this event, a combination of the command decoder 11 and the row decoder 15 will be referred to as a selecting arrangement. In addition, each of the sense amplifier groups 22 supplies the first and the second plate selection signals to an array OR gate 25. Each of the sense amplifier groups 22 is referred to as a first processing arrangement.

Each of the first and the second read bus pairs 23 and 24 comprises two read buses. Dependent on the first read bus signal, the read buses of the first read bus pair 23 produce a potential difference therebetween which will be called hereunder a first read bus potential difference. Dependent on the second read bus signal, the read buses of the second read bus pair 23 produce a potential difference therebetween which will be called hereunder a second read bus potential difference.

In relation to each of the sense amplifier groups 22, the conventional semiconductor memory device further comprises a precharge control circuit 26, a first main data amplifier 27, a second main data amplifier 28, a first supplementary data amplifier 31, a second supplementary data amplifier 32. The precharge control circuit 26 is connected to the pulse generating circuit 12, the column decoder 14, and the array OR gate 25. In the manner which will later be described in detail, the precharge control circuit 26 produces a data amplifier enabling and a read bus precharging signal in accordance with the first and the second pulse signals, the first and the second column address signals, and a gate output signal which is supplied from the OR gate 25.

The first main data amplifier 27 is connected to the first read bus pair 23 and the precharge control circuit 26 and is for amplifying the data amplifier enabling and the read bus precharging signals with reference to the first read bus potential difference into a first main amplified signal and a first main modified signal modified from the first-main amplified signal. The first main amplified and the first main modified signals are supplied to the first supplementary data amplifier 31 through a first read write bus pair 33. With reference to the second pulse signal that is supplied from the pulse generating circuit 12, the first supplementary data amplifier 31 amplifies the first main amplified and the first main modified signals to produce a first read out data signal as a second difference signal.

The second main data amplifier 28 is connected to the second read bus pair 24 and the precharge control circuit 26 and is amplifying the data amplifier enabling and the read bus precharging signals with reference to the second read bus potential difference into a second main amplified signal and a second main modified signal modified from the second main amplified signal. The second main amplified and the second main modified signals are supplied to the second supplementary data amplifier 32 through a second read write bus pair 34. With reference to the second pulse signal, the second supplementary data amplifier 32 amplifies the second main amplified and the second main modified signals to produce a second read out data signal as the second difference signal. Each of the first and the second main data amplifiers 27 and 28 is referred to as a second processing arrangement.

The conventional semiconductor memory device further comprises first and second data output buffers 35 and 36. The first data output buffer 35 is connected to the first supplementary data amplifier 31 and is for driving a first data output pad DQ1 in response to the first read out data signal. The second data output buffer 36 is connected to the second supplementary data amplifier 32 and is for driving a second data output pad DQ2 in response to the first read out data signal.

Figure 2:
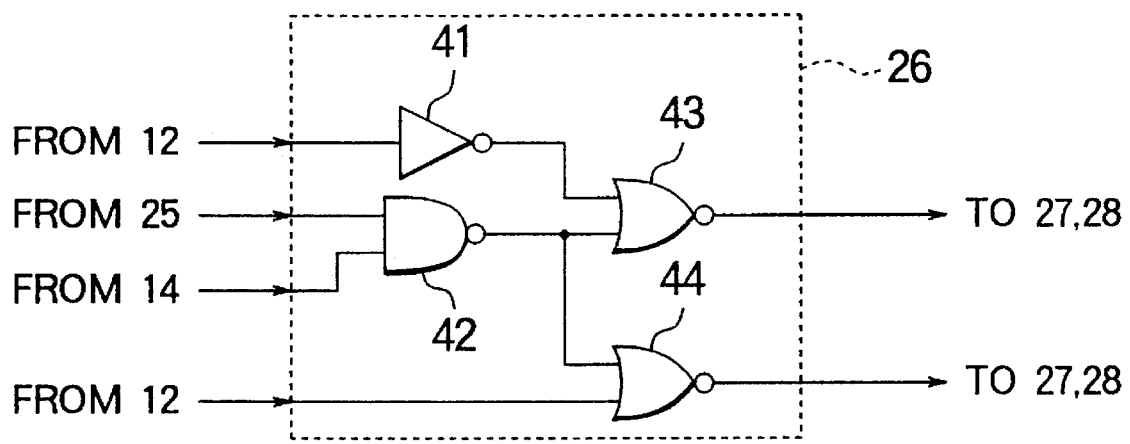
FIG. 2 is a block diagram of a precharge circuit included in the conventional semiconductor memory device of FIG. 1.

Turning to FIG. 2, the description will be made as regards the precharge control circuit 26. The precharge control circuit 26 comprises an inverter 41, a NAND gate 42, a first NOR gate 43, and a second NOR gate 44. The inverter 41 is connected to the pulse generating circuit 12 and is for producing an inverted pulse signal in response to absence of the second pulse signal. The NAND gate 42 is connected to the array NOR gate 25 and the column decoder 14 and is for producing a local gate signal in accordance to absence of both of the gate output and the first column address signals. The first NOR gate 43 is connected to the inverter 41, the NAND gate 42, the first primary data amplifier 27, and the second primary data amplifier 28, and is for producing the read bus precharging signal in accordance with absence of at least one of the inverted pulse and the local gate signals. The second NOR gate 44 is connected to the NAND gate 42, the pulse generating circuit 12, the first primary data amplifier 27, and the second primary data amplifier 28 and is for producing the data amplifier enabling signal in accordance with absence of at least one of the local gate signal and the first pulse signal.

Figure 3:
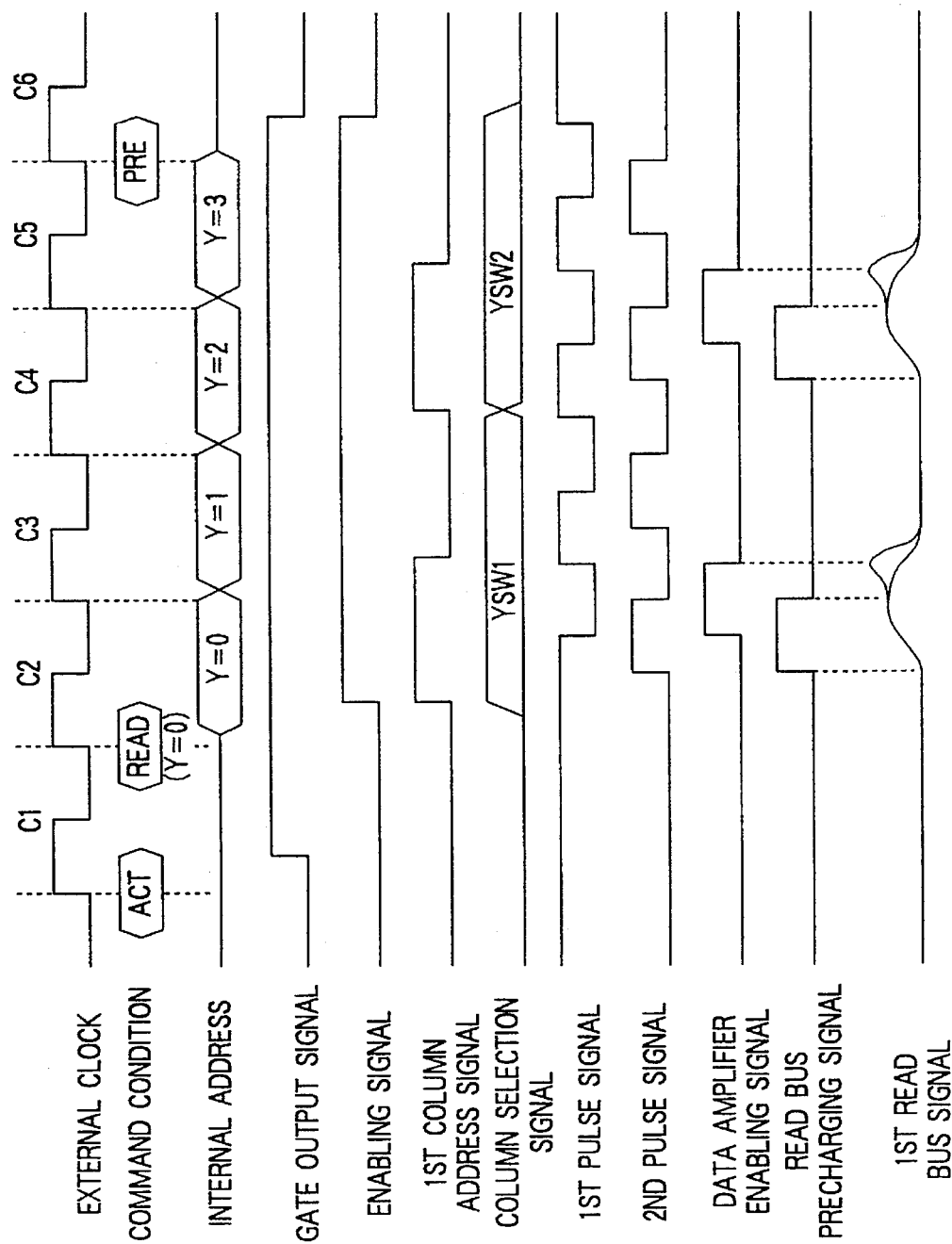
FIG. 3 is a view for describing operation of the conventional semiconductor memory device of FIG. 1.

Turning to FIG. 3 in addition, the description will be directed to operation of the conventional semiconductor memory device. It is assumed that a signal combination of the row address strobe, the column address strobe, and the write signals is rendered in an active command input condition at a rise of the external clock in a first cycle C1. In this event, the activation signal is put into an activated state. In response to the activation and the additional external address signals at that time, the row decoder 15 selects a selected one of the word lines 18. The plate selection signals that is for a memory cell plate containing the selected word lines are turned into a high level.

Then, after a lapse of a predetermined time interval, it is assumed that the signal combination of the row address strobe, the column address strobe, and the write signals is put into a read command input condition at a rise of the external clock in a second cycle C2. In the read command input condition, a read command may be supplied to the command decoder 11 through the row address, the column address, and the write input terminals RAS, CAS, and WE. Those terminals RAS, CAS, and WE will collectively called a read command signal arrangement. In this event, the enabling signal is activated and turned into a high level to make the burst counter 13 generate the internal address signal. In response to the internal address signal, the column decoder 14 produces a selected one of the column selection signals. Dependent on the internal address signal, the column decoder 14 makes either one of the first and the second column address signals be activated and turned into a high level.

The first pulse signal, which has been kept at a high level, is turned into a one-shot low pulse in response to the enabling signal of the high level. The second pulse signal, which has been kept at a low level, is turned into a one-shot high pulse in response to the enabling signal of the high level.

By way of example, the description will be made as regards a case where a burst length is equal to 4, a column address strobe signal (CAS) latency being equal to 1, and a column address (Y=0) being supplied from an external source.

In the second cycle C2, the column address (Y= 0) straightforwardly becomes an internal address. Thus, the internal address is (Y=0) also.

Next, in a third cycle C3, the internal address is incremented by the burst counter 13 to become (Y=1). In the similar manner, the internal address becomes (Y= 2) in a fourth cycle C4 and (Y=3) in a fifth cycle C5.

The first column address signal has a high level and a low level when the enabling signal has a high level and the internal address signal has a low level and when the enabling signal has a low level or the internal address signal has a high level, respectively. The second column address signal has a high level and a low level when the enabling signal has a high level and the internal address signal has a high level and when the enabling signal has a low level or the internal address signal has a low level, respectively. Accordingly, in each of the second and the fourth cycles C2 and C4, the first column address signal has a high level while the second column address signal has a low level. In each of the third and the fifth cycles C3 and C5, the first column address signal has a low level while the second column address signal has a high level. In other cycles, each of the first and the second column address signals has a low level.

The column selection signals are produced in the column decoder 14 so that a first column selection signal YSW1 is kept during the second and the third cycles C2 and C3 and that a second column selection signal YSW1 is kept during the fourth and the fifth cycles C4 and C5, YSW2 is selected.

In a sixth cycle C6 after the end of a 4-bit burst, the enabling signal is turned into a low level to become inactive. The first and the second column selection signals are turned into a low level. In response to a precharge command known in the art, the memory cells 17 are precharged with the word lines 18 becoming inactive.

While the enabling signal has a high level, each of the first and the second pulse signals becomes a one-short pulse signal in each of the second, the third, the fourth, and the fifth cycles C2, C3, C4, and C5.

Each of the data amplifier enabling and the read bus precharging signals becomes a one-shot high pulse signal in the second and the fourth cycles C2 and C4 during which each of the enabling signal and the first column address signal has a high level.

In the meanwhile, the first and the second pulse signals are generated in the pulse generating circuit 12 with a time sequential order in which the second pulse signal is turned from low to high, the first pulse signal from high to low, the second pulse signal from high to low, and the first pulse signal from low to high.

Accordingly, the data amplifier enabling and the read bus precharging signals obtained by a logical operation of those signals are produced at timings illustrated in the figure.

When the read bus precharging signal is turned into a high level, the data amplifier enabling signal is turned from a ground level or the low level to a high level to activate each of the first and the second primary data amplifiers 27 and 28. As a result, the first and the second read bus pairs 23 and 24 are brought into a precharged state and electrically charged in the precharged state. The read bus precharging signal is then turned into the low level to release the precharged state.

When the precharged state is released, data of the sense amplifiers 21 are transmitted to the first and the second read bus pairs 23 and 24. Thereafter, when the data amplifier enabling signal is turned into the low level, each of the first and the second main data amplifiers 27 and 28 is rendered inactive to inform each of the first and the second read bus pairs 23 and 24 with that the data amplifier enabling signal is turned from the high level to the low level.

Each of the first and the second read bus pairs 23 and 24 is kept at the ground level except when a readout operation is carried out. This is because each of the first and the second read bus pairs 23 and 24 is connected, in the shared-type sense amplifier, to the ground through an N-channel transistor having a gate used as the bit line and through another N-channel transistor having a gate used as a column selection line which is supplied with one of the column selection signals, so that, a DC current path is present between each of the first and the second read out bus pairs 23 and 24 and the ground.

Figure 4:
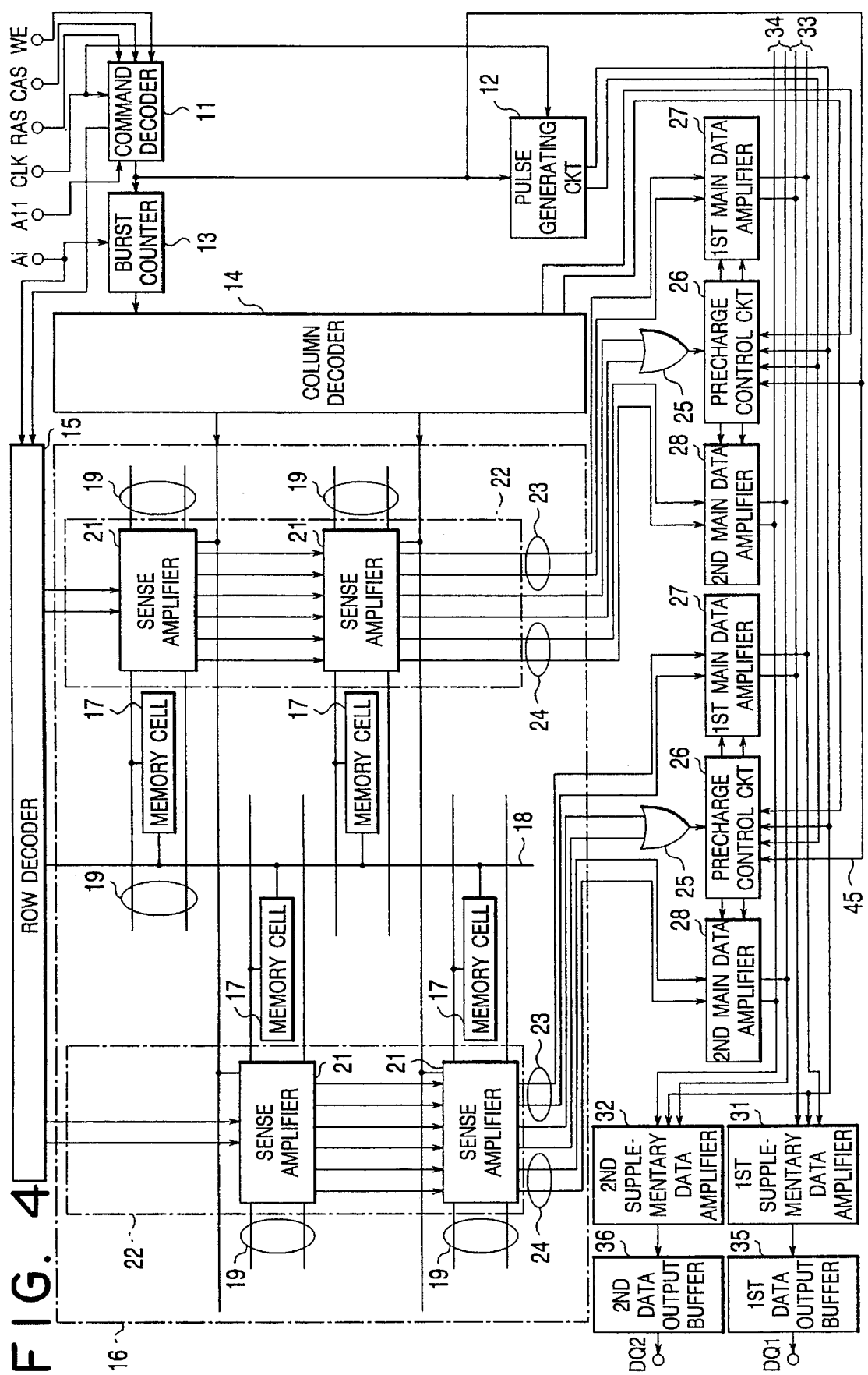
FIG. 4 is a block diagram of a semiconductor memory device according to a first embodiment of this invention.

Turning to FIG. 4, the description will proceed to a semiconductor memory device according to a first embodiment of this invention. The semiconductor memory device comprises similar parts designated by like reference numerals. It is to be noted in the semiconductor memory device that the precharge control circuit 26 is further connected to the command decoder 11 through a line 45 and supplied with the enabling signal.

Figure 5:
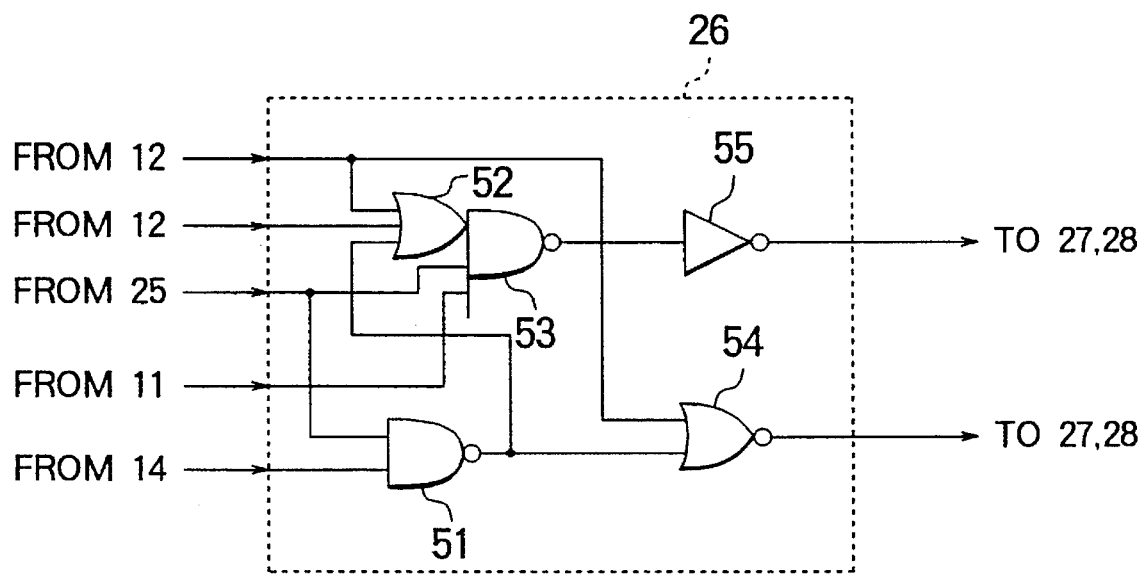
FIG. 5 is a block diagram of a precharge circuit included in the semiconductor memory device of FIG. 4.

Turning to FIG. 5, the description will be made with regard to the precharge control circuit 26 included in the semiconductor memory device of FIG. 4. The precharge control circuit 26 comprises a first NAND gate 51, a circuit OR gate 52, a second NAND gate 53, a NOR gate 54, and an inverter 55. The first NAND gate 51 is connected to the column decoder 14 and the array OR gate 25 and is for producing a first local signal in accordance with absence of both of the first column address and the gate output signals. The circuit OR gate 52 is connected to the pulse generating circuit 12 and the first NAND gate 51 and is for producing a second local signal in accordance with presence of at least one of the first and the second pulse signals and the first local signal. The second NAND gate 53 is connected to the command decoder 11, the array OR gate 25, and the circuit OR gate 52 and is for producing a third local signal in accordance with absence of all of the enabling, the gate output., and the second local signals. The NOR gate 54 is connected to the pulse generating circuit 12, the first NAND gate 51, the first primary data amplifier 27, and the second primary data amplifier 28 and is for producing the data amplifier enabling signal in accordance with absence of at least one of the first and the third local signals. The inverter 55 is connected to the second NAND gate 53, the first primary data amplifier 27, and the second primary data amplifier 28 and is for producing the read bus precharging signal in response to absence of the third local signal.

Figure 6:
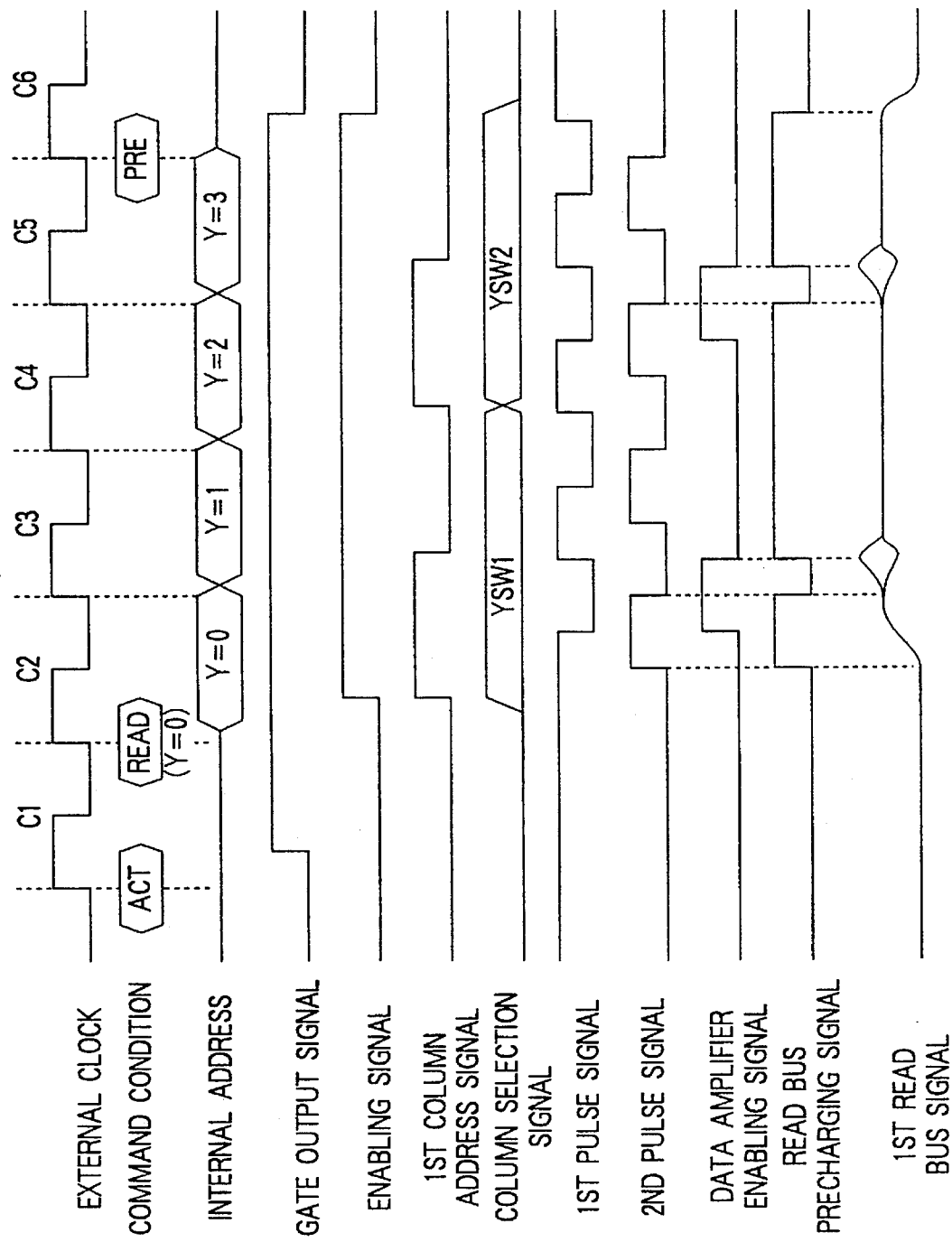
FIG. 6 is a view for describing operation of the semiconductor memory device illustrated in FIG. 4.

Turning to FIG. 6, the description will be directed to operation of the semiconductor memory device of FIGS. 4 and 5. In FIG. 6, the external clock, the command condition, the internal address, the gate output signal, the enabling signal, the first column address signal, the column selection signal, the first pulse signal, the second pulse signal are similar to those in FIG. 3. In addition, the data amplifier enabling signal of FIG. 6 is similar to that of FIG. 3.

During a period in which both of the gate output and the enabling signals have a high level, the read bus precharging signal has a high level to precharge each of the first and the second read bus pairs 23 and 24, except when the first pulse signal, the second pulse signal, and the data amplifier enabling signal have a low level, a low level, and a high level, respectively.

Accordingly, each of the first and the second read bus potential differences is amplified in each of the first and the second read bus pairs 23 and 24 during when the data amplifier enabling signal is turned into a high level and thereafter the second pulse signal becomes a low level so that precharge is disabled. Thereafter, the data amplifier enabling signal is turned into a low level to make the first and the second main data amplifiers 27 and 28 become disabled. In this event, the first and the second read bus pairs 23 and 24 are put into the precharged state. While the first column address signal has a low level, the first local signal has a high level even if both of the first and the second pulse signals have a low level. Therefore, the read bus precharging signal is maintained at a high level to keep each of the first and the second read bus pair into the precharged state.

As a result, the enabling signal, which has a high level only during a burst period after input of the read command, and the plate selection signals are used to precharge that ones of the read buses which is possibly accessed during the burst period. Herein, the command decoder 11 is referred to as a period determining arrangement for determining the burst period.

In order to reduce the DC current from each of the read buses to the ground line in the shared-type sense amplifier, minimum essential ones of the read buses are precharged with the charging/discharging current of each of the read buses being suppressed during the burst period.

The DC current consumed in the shared sense amplifier from one of read buses to the ground line during one cycle is represented by Id. The charging/discharging current of one of the read buses in one cycle is represented by Ij. Assuming that the read buses possibly accessed during the burst period are M in number, the current i consumed by the read buses, when N in burst, is given by:

$$i = (Id \times N + Ij) \times M. \tag{1}$$

On the other hand, the current i' in the prior art is given by:

$$i' = (Id \times N + Ij \times N) \times M/2. \tag{2}$$

The difference (i'−i) between this embodiment and the prior art is calculated from Equations (1) and (2) as follows:

$$\begin{aligned} i' - i &= (Id \times N + Ij \times N) \times M/2 - (Id \times N + Ij) \times M \\ &= Ij\,M(N/2 - 1) - 1/2 Id\,N\,M \end{aligned} \tag{3}$$

Herein, Id is a DC current and becomes small in proportion to the cycle time. On the other hand, Ij is constant independently of the cycle time. Accordingly, when the cycle time is shortened in a synchronous DRAM or the like, the ratio occupied by the charging/discharging current of the read bus becomes large.

As described above, all of those read buses, which are possibly accessed during the burst period in response to the column address supplied from the external source, are enabled. When the data amplifier amplifying the read bus pair during the burst period is inactive, at east the precharge state is maintained. Thus, the charging/discharging current of the read bus during the burst period can be reduced to suppress the noise on each of the power supply line and the ground line.

Figure 7:
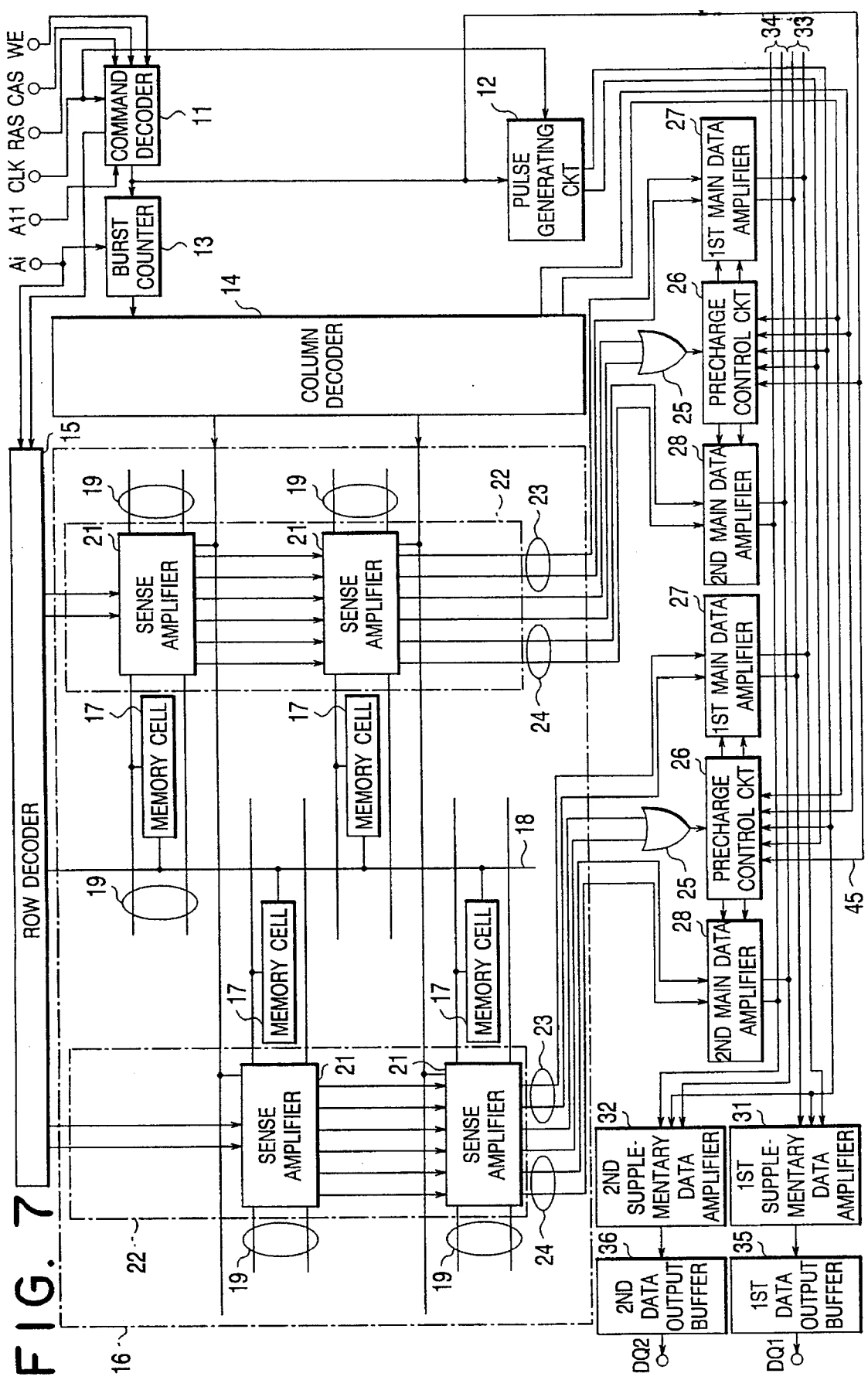
FIG. 7 is a block diagram of a semiconductor memory device according to a second embodiment of this invention.

Turning to FIG. 7, the description will proceed to a semiconductor memory device according to a second embodiment of this invention. The semiconductor memory device comprises similar parts designated by like reference numerals. It is to be noted in the semiconductor memory device that the precharge control circuit 26 is supplied with both of the first and the second column address signals.

Figure 8:
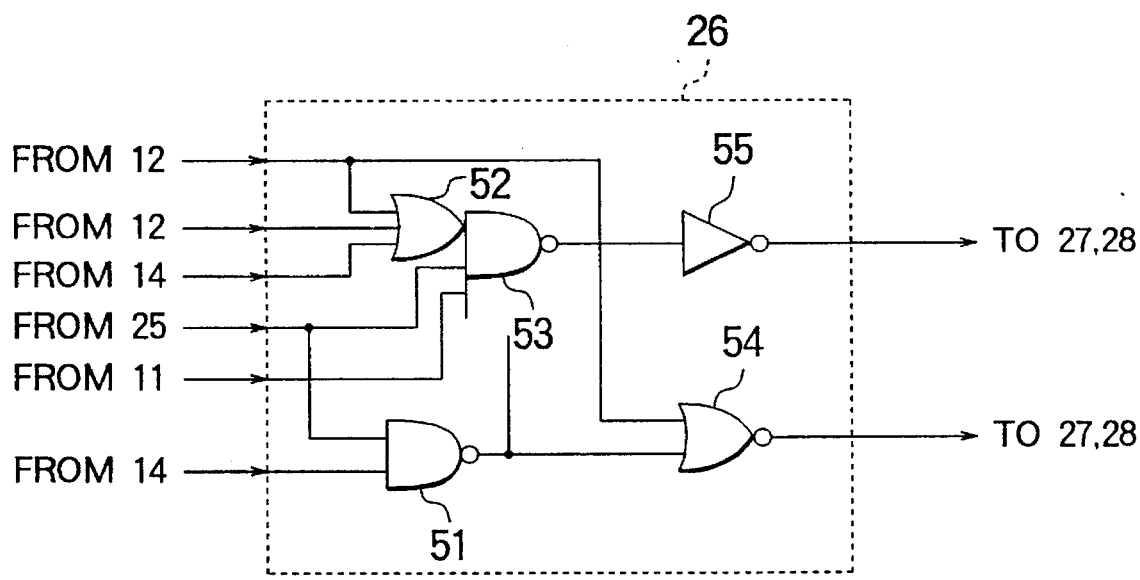
FIG. 8 is a block diagram of a precharge circuit included in the semiconductor memory device of FIG. 7.

Turning to FIG. 8, the description will be made with regard to the precharge control circuit 26 included in the semiconductor memory device of FIG. 7. The precharge control circuit 26 comprises similar parts designated by like reference numerals. In the precharge control circuit 26 illustrated in FIG. 8, the circuit OR gate 52 is connected to the column decoder 14 in place of the first NAND gate 51 and is supplied with the second column address signal in place of the first local signal.

It is to be noted that the semiconductor memory device of FIG. 4 is constituted as follows.

The first and the second main data amplifiers 27 and 28 process the read bus potential difference into the second difference signal to electrically charge the read bus pairs 23 and 24 in accordance with the second difference signal. The precharge control circuit 26 controls operation of each of the first and the second main data amplifiers 27 and 28 so that the selected ones of the read bus pairs 23 and 24 are electrically charged during the burst period except when each of the read bus pairs 23 and 24 produces the second difference signal.

The burst period has a start point and an end point. The precharge control circuit 26 is responsive to the start point for making the first and the second main data amplifiers 27 and 28 be brought into an electrically charging state in which the selected ones of the read bus pairs 23 and 24 are electrically charged. In this event, the precharge control circuit 26 will be referred to as a charge-keeping arrangement. Furthermore, the precharge control circuit 26 keeps the first and the second main data amplifiers 27 and 28 into the electrically charging state until the burst period reaches to the end point. In this event, the precharge control circuit 26 will be referred to as a state-keeping arrangement. Furthermore, the precharge control circuit 26 is responsive to the end point for making the first and the second main data amplifiers 27 and 28 be brought into an electrically discharging state in which the selected ones of the read bus pairs 23 and 24 are electrically discharged while the first and the second main data amplifiers 27 and 28 produce the second difference signal. In this event, the precharge control circuit 26 will be referred to as a discharge-making arrangement.

On producing the data amplifier enabling signal, the precharge control circuit 26 will be referred to as a signal producing arrangement. The precharge control circuit 26 is responsive to the data amplifier enabling signal for activating, as an activated data amplifier, one of selected ones of the first and the second main data amplifiers 27 and 28. In this event, the precharge control circuit 26 will be referred to as an activating arrangement. The precharge control circuit 26 prevents the first and the second main data amplifiers 27 and 28 from making the particular one be electrically charged. In this event, the precharge control signal 26 will be referred to as a preventing arrangement.

What is claimed is:

1. A semiconductor memory device comprising:

period determining means for determining a burst period;

a plurality of memory cells;

a plurality of word lines connected to said memory cells;

a plurality of bit line pairs connected to said memory cells, each of said bit line pairs comprising two bit lines having a bit line potential difference therebetween;

first processing means connected to said bit line pairs for processing said bit line potential difference into a first difference signal;

a plurality of read bus pairs connected to said first processing means and supplied with said first difference signal, each of said read bus pairs comprising two read buses having a read bus potential difference therebetween in dependence on said first difference signal;

second processing means connected to said read bus pairs for processing said read bus potential difference into a second difference signal to electrically charge said read bus pairs in accordance with the second difference signal; and control means connected to said period determining means and said second processing means for controlling operation of said second processing means so that selected ones of said read bus pairs are electrically charged during said burst period except when said second processing means produces said second difference signal.

2. A semiconductor memory device as claimed in claim 1, further comprising:

read command input means for inputting a read command; and selecting means connected to said period determining means and said read command input means for selecting said selected ones from said read bus pairs with reference to said burst period and said read command.

3. A semiconductor memory device as claimed in claim 1, said burst period having a start point and an end point, wherein said control means comprises:

charge-making means connected to said second processing means and responsive to said start point for making said second processing means be brought into an electrically charging state in which said selected ones of the read bus pairs are electrically charged;

state-keeping means connected to said second processing means for keeping said second processing means into said electrically charging state until said burst period reaches to said end point; and discharge-making means connected to said second processing means and responsive to said end point for making said second processing means be brought into an electrically discharging state in which said selected ones of the read bus pairs are electrically discharged while said second processing means produces said second difference signal.

4. A semiconductor memory device as claimed in claim 1, wherein said second processing means comprises a plurality of data amplifiers connected to said read bus pairs, respectively, said control means comprising:

signal producing means for producing a data amplifier enabling signal;

activating means connected to said data amplifiers and said signal producing means for activating, as an activated data amplifier, one of selected ones of said data amplifiers in response to said data amplifier enabling signal, said activated data amplifier being connected to a particular one of said selected ones of the read bus pairs; and preventing means connected to said second processing means and said activating means for preventing said second processing means from making said particular one be electrically charged.

5. A semiconductor memory device as claimed in claim 4, further comprising:

a clock input terminal for being supplied with an external clock; and a burst counter connected to said clock input terminal for generating a column address signal in synchronism with said external clock, said column address signal having a first signal level and a second signal level higher than said first signal level;

said signal producing means being connected to said burst counter and producing said data amplifier enabling signal when said column address signal has said second signal level.

6. A method of controlling operation of a semiconductor memory device comprising period determining means for determining a burst period, a plurality of memory cells, a plurality of word lines connected to said memory cells, a plurality of bit line pairs connected to said memory cells, each of said bit line pairs comprising two bit lines having bit line potential difference therebetween, first processing means connected to said bit line pairs for processing said bit line potential difference into a first difference signal, and a plurality of read bus pairs connected to said first processing means and supplied with said first difference signal, each of said read bus pairs comprising two read buses having a read bus potential difference therebetween in dependence on said first difference signal, wherein said method comprises the steps of:

processing said read bus potential difference into a second difference signal to electrically charge said read bus pairs in accordance with the second difference signal; and making selected ones of said read bus pairs be electrically charged during said burst period except when said read bus potential difference is processed into said second difference signal.

* * * * *

UNITED STATES PATENT AND TRADEMARK OFFICE
CERTIFICATE OF CORRECTION

PATENT NO. : 5,463,581
DATED : October 31, 1995
INVENTOR(S) : Yasuji Koshikawa

It is certified that error appears in the above-indentified patent and that said Letters Patent is hereby corrected as shown below:

On the Title page, item [30];

In the Foreign Application Priority Data, delete "Aug. 29, 1993" and insert --Aug. 26, 1993--.

Signed and Sealed this

Ninth Day of July, 1996

Attest:

BRUCE LEHMAN

Attesting Officer

Commissioner of Patents and Trademarks